(12) United States Patent
Magana et al.

(10) Patent No.: US 11,604,406 B2
(45) Date of Patent: Mar. 14, 2023

(54) METHOD AND APPARATUS FOR FABRICATION OF VERY LARGE SCALE INTEGRATION PATTERN FEATURES VIA ELECTROLESS DEPOSITION ON EXTREME ULTRAVIOLET LITHOGRAPHY PHOTOMASKS

(71) Applicant: Intel Corporation, Santa Clara, CA (US)

(72) Inventors: John Magana, San Jose, CA (US); Guojing Zhang, Saratoga, CA (US); Yang Cao, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 719 days.

(21) Appl. No.: 16/521,445

(22) Filed: Jul. 24, 2019

(65) Prior Publication Data

US 2021/0026234 A1    Jan. 28, 2021

(51) Int. Cl.
  *G03F 1/24*       (2012.01)
(52) U.S. Cl.
  CPC .................................... *G03F 1/24* (2013.01)
(58) Field of Classification Search
  CPC ......................................................... G03F 1/24
  USPC ........................................................... 430/5
  See application file for complete search history.

(56) References Cited

U.S. PATENT DOCUMENTS

| | | | | |
|---|---|---|---|---|
| 10,551,732 B2 * | 2/2020 | Hassan | .................. | C23C 16/042 |
| 11,126,077 B2 * | 9/2021 | Hsu | .......................... | G03F 1/36 |
| 11,392,022 B2 * | 7/2022 | Shih | ..................... | G03F 7/2004 |
| 11,402,743 B2 * | 8/2022 | Lu | ............................. | G03F 1/36 |
| 2020/0050097 A1 * | 2/2020 | Magana | .................. | G03F 1/24 |
| 2021/0026234 A1 * | 1/2021 | Magana | .................. | G03F 1/80 |
| 2022/0082928 A1 * | 3/2022 | Hsu | ............................. | G03F 1/58 |
| 2022/0121101 A1 * | 4/2022 | Tanady | .................... | G03F 1/38 |
| 2022/0137499 A1 * | 5/2022 | Hsu | ............................ | G03F 1/24 |
| | | | | 430/5 |
| 2022/0269163 A1 * | 8/2022 | Lin | ........................... | G03F 1/38 |

* cited by examiner

*Primary Examiner* — Christopher G Young
(74) *Attorney, Agent, or Firm* — Schwabe, Williamson & Wyatt, P.C.

(57) ABSTRACT

Embodiments disclosed herein include EUV reticles and methods of forming such reticles. In an embodiment a method of forming an EUV reticle comprises providing a reticle, where the reticle comprises, a substrate, a mirror layer over the substrate, where the mirror layer comprises a plurality of first mirror layers and second mirror layers in an alternating pattern, and a capping layer over the mirror layer. In an embodiment, the method may further comprise disposing a first layer over the capping layer, patterning an opening in the first layer, and disposing a second layer in the opening, where the second layer is disposed with an electroless deposition process.

22 Claims, 12 Drawing Sheets

METHOD AND APPARATUS FOR FABRICATION OF VERY LARGE SCALE INTEGRATION PATTERN FEATURES VIA ELECTROLESS DEPOSITION ON EXTREME ULTRAVIOLET LITHOGRAPHY PHOTOMASKS

TECHNICAL FIELD

Embodiments of the disclosure are in the field of semiconductor fabrication, and in particular, to reticles for extreme ultraviolet (EUV) lithography.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity and functionality. The drive for ever-more capacity, however, is not without issue. Particularly, the critical dimensions are beginning to scale beyond the resolution capacity of existing lithographic patterning processes, such as deep ultraviolet (DUV) lithography.

Extreme ultraviolet (EUV) lithography allows for the critical dimension scaling to continue. However, the transition to EUV lithography has many engineering obstacles to overcome in order to be integrated into high volume manufacturing operations. One particular obstacle that must be overcome is the improvement of the material selection and fabrication processes of the absorber layer. Ideally, as the name implies, the absorber layer should have a high absorption coefficient for EUV radiation. However, the deposition and patterning of the absorption layer must be implemented at low temperatures (e.g., approximately 130° C. or less). This is because elevated temperatures will cause interdiffusion between the alternating mirror layers, and therefore, reduces the efficiency of the reticle.

Currently, an absorber layer is blanket deposited over the mirror layer (e.g., with low temperature physical vapor deposition (PVD), ion beam deposition (IBD), or the like), and then subtractively patterned (e.g., with reactive ion etching (RIE)). Due to the need to keep the temperature below approximately 130° C., the class of materials that may be deposited and subtractively etched with such processes is limited to only a few practical materials. For example, absorber layers are typically formed with TaN or TaBN.

DESCRIPTION OF THE EMBODIMENTS

Figure 1:
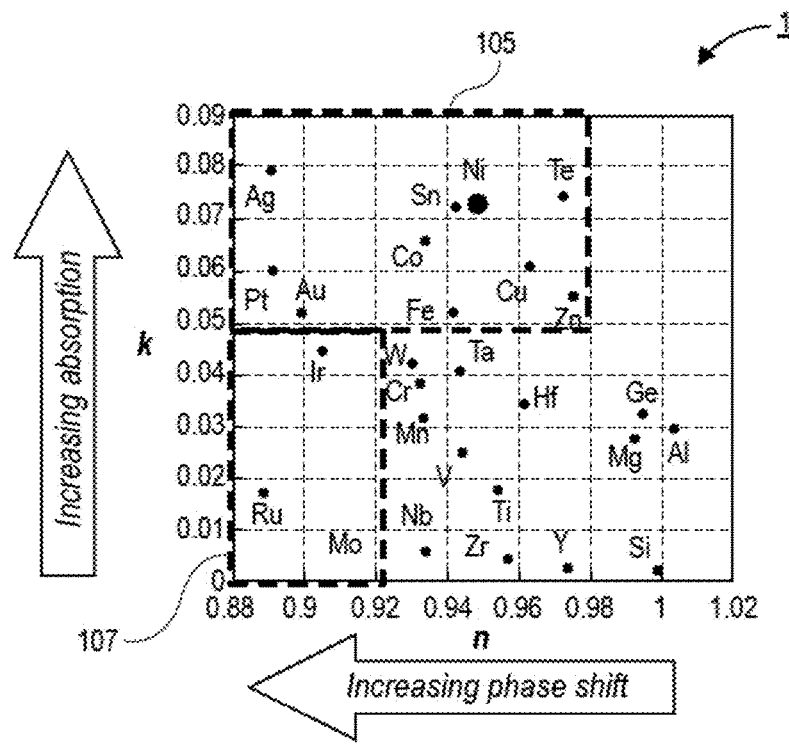
FIG. 1 is a graph depicting the absorption properties and phase shift properties of various materials.

Embodiments described herein comprise extreme ultraviolet (EUV) reticles absorber layers and/or phase shift layers that are deposited with an electroless deposition process and methods of forming such EUV reticles. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently available EUV reticles have suboptimal absorber layers and phase shift layers. Particularly, since deposition and patterning processes are restricted to low temperatures (e.g., approximately 130° C. and lower) due to the alternating mirror layers, the material classes available are severely limited. Accordingly, embodiments disclosed herein include a low temperature electroless deposition process suitable for forming absorber layers and/or phase shifting layers. The use of an electroless process broadens the class of materials for the absorber layer and the phase shift layer. As such, materials with higher absorption coefficients and/or higher phase shifting characteristics may be selected in order to improve EUV reticles. Particularly, the use of materials with more desirable properties delivers improved efficiency, image contrast, and normalized image log slope (NILS). Additionally, extremely low horizontal to vertical (HV) pattern bias is enabled since the thickness of the absorber layer may be reduced when using materials with higher absorption coefficients.

Referring now to FIG. 1, a graph 100 that plots the absorption coefficient k with respect to the refractive index n for a variety of materials is shown, in accordance with an embodiment. In an embodiment, region 105 depicts materials with high absorption coefficients k that are suitable for use as for the absorber layer, and region 107 depicts materials with refractive indices n that are suitable for use as a phase shifting layer. As shown, tantalum (Ta) is outside of the desirable regions 105 and 107. However, since materials comprising Ta (e.g., TaN and TaBN) are compatible with low temperature deposition and subtractive etching processes, it is currently used in many EUV reticles. Embodiments disclosed herein allow for the deposition of materials with improved absorption coefficients k and phase shift parameters n, such as those depicted in region 105 and region 107, alloys of such materials, and other suitable materials not shown in FIG. 1. In a particular embodiment, the absorber layer and/or the phase shift layer may comprise platinum group elements (e.g., ruthenium (Ru), rhodium (Rh), palladium (Pd), platinum (Pt), etc.) or transition metals (e.g., nickel (Ni), cobalt (Co), gold (Au), etc.).

Referring now to FIGS. 2A-2E, a series of cross-sectional illustrations depicting a process for forming an absorber layer on an EUV reticle 210 with an electroless deposition process is shown, in accordance with an embodiment. In the illustrated embodiment, a single portion of the absorber layer is shown for simplicity. However, it is to be appreciated that a patterned absorber layer may be formed with minimum feature sizes suitable for EUV lithography. For example, the electroless process disclosed herein may enable minimum feature sizes of 10 nm or less or 5 nm or less while still maintaining excellent pattern fidelity.

Figure 2A:
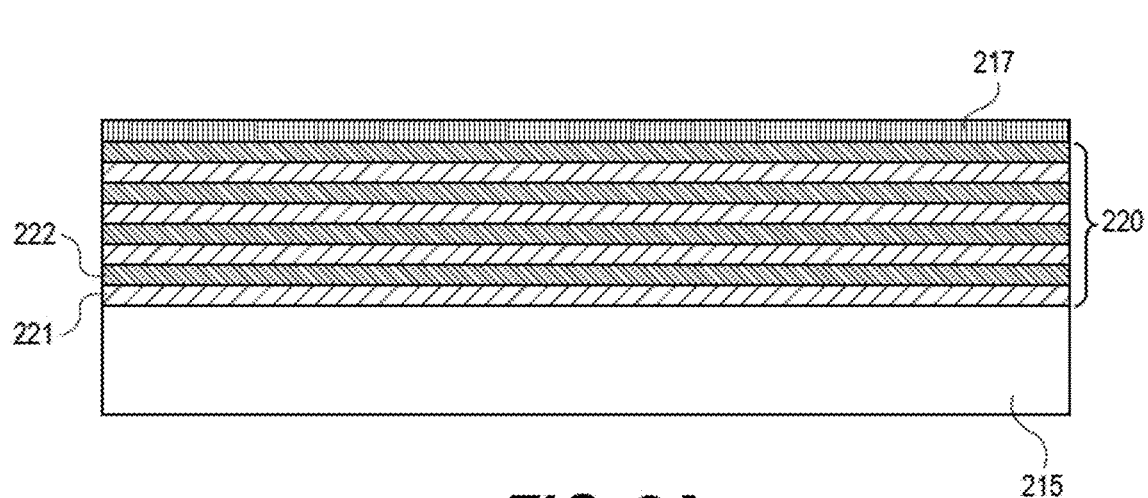
FIG. 2A is a cross-sectional illustration of an extreme ultra violet (EUV) reticle, in accordance with an embodiment.

Referring now to FIG. 2A, a cross-sectional illustration of a reticle 210 is shown, in accordance with an embodiment. In an embodiment, the reticle 210 may comprise a substrate 215 and a mirror layer 220 over the substrate 215. The substrate 215 may be any dimensionally stable material (i.e., a material with a low coefficient of thermal expansion (CTE)). For example, the substrate 215 may comprise quartz or titanium doped quartz. In an embodiment, the mirror layer 220 may comprise a plurality of alternating first mirror layers 221 and second mirror layers 222. The mirror layer 220 is tuned to reflect the EUV radiation (i.e., 13.5 nm). Common first mirror layer 221 and second mirror layer 222 combinations include molybdenum and silicon, but a plurality of other materials combinations can also be employed. In the illustrated embodiment, there are eight first mirror layers 221 and eight second mirror layers 222. However, it is to be appreciated that the mirror layer 220 may comprise any number of first mirror layers 221 and second mirror layers 222. For example, there may be ten or more alternating layers or fifty or more alternating layers. In a particular embodiment, there may be forty alternating layers. In an embodiment, a capping layer 217 is formed over the mirror layer 220. In an embodiment, the capping layer 217 may be ruthenium.

Figure 2B:
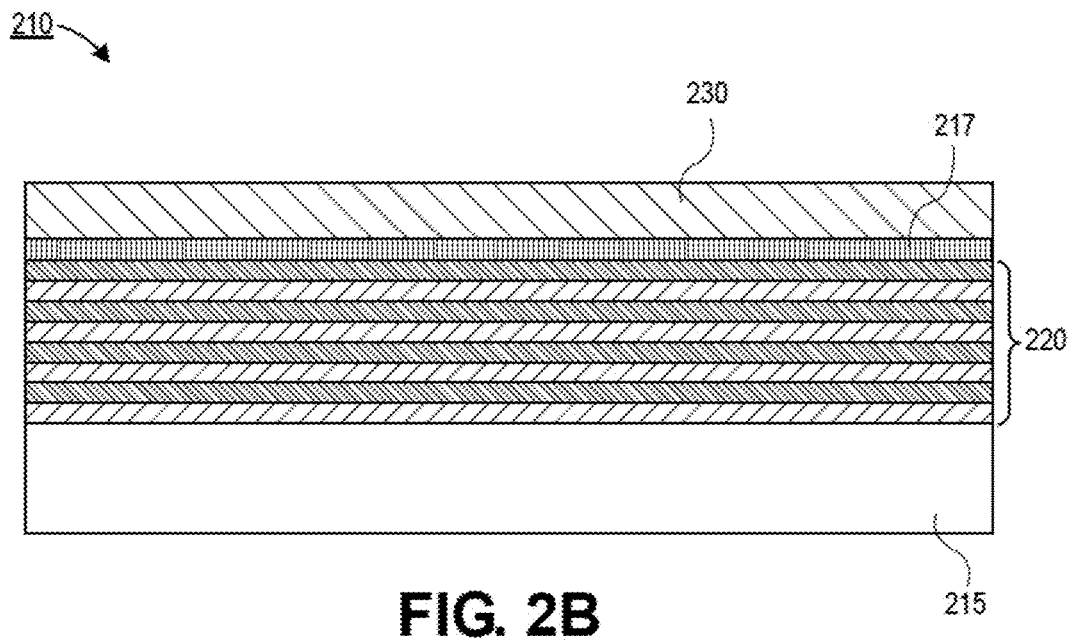
FIG. 2B is a cross-sectional illustration of the EUV reticle after a sacrificial layer is disposed over a capping layer, in accordance with an embodiment.

Referring now to FIG. 2B, a cross-sectional illustration of the EUV reticle 210 after a sacrificial layer 230 is disposed over the capping layer 217 is shown, in accordance with an embodiment. In an embodiment, the sacrificial layer 230 may be any suitable material that is lithographically definable at low temperatures. In a particular embodiment, the sacrificial layer 230 may be a photoresist material. In other embodiments, the sacrificial layer 230 may be a polymer (e.g., poly xylylene), oxides (e.g., silicon dioxide), or any other suitable non-reactive metal or metal alloy system. As used herein, the sacrificial layer 230 may sometimes be referred to as a first layer.

Figure 2C:
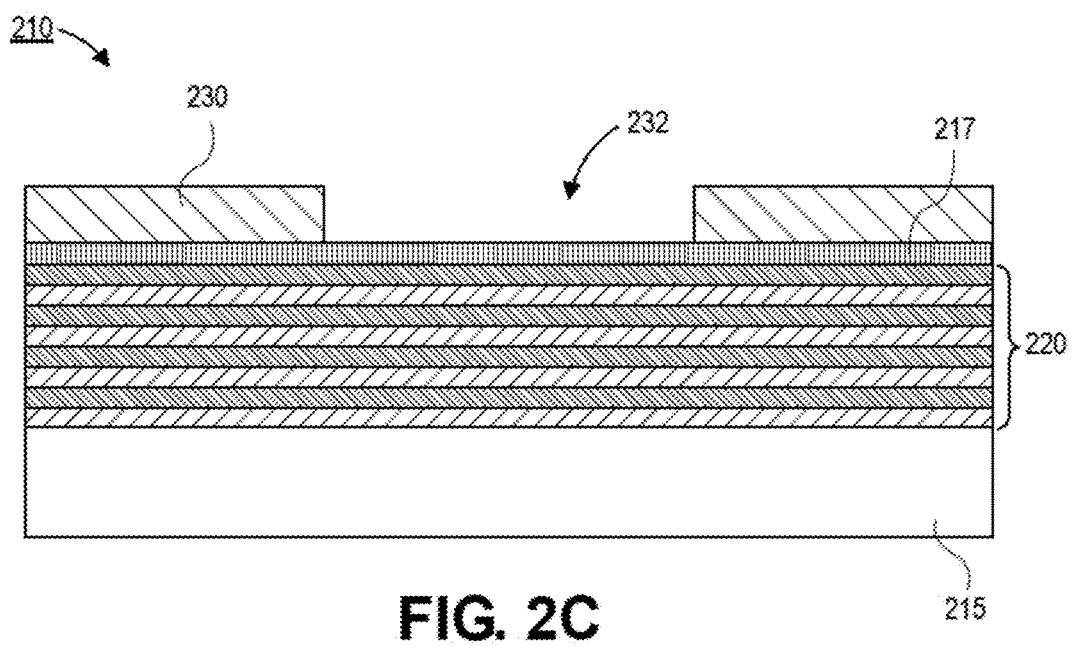
FIG. 2C is a cross-sectional illustration of the EUV reticle after the sacrificial layer is patterned, in accordance with an embodiment.

Referring now to FIG. 2C, a cross-sectional illustration of the EUV reticle 210 after the sacrificial layer 230 is patterned is shown, in accordance with an embodiment. In an embodiment, the sacrificial layer 230 may be patterned with any suitable low temperature patterning process. For example, in the case of a photoresist material for the sacrificial layer 230, the sacrificial layer 230 may be exposed with actinic radiation and developed using a developing solution. In the case of sacrificial layers 230 that are not photoactive, the sacrificial layer 230 may be patterned with a lithography process that comprises depositing a resist layer (not shown) over the sacrificial layer 230, patterning the resist layer, and transferring the pattern into the sacrificial layer 230.

In an embodiment, the sacrificial layer 230 may be patterned as a negative of the desired pattern of the subsequently formed absorber layer. That is, the sacrificial layer 230 may be patterned to include a plurality of openings 232 where the absorber layer will ultimately be formed. In an embodiment, the openings 232 expose a portion of the capping layer 217. In an embodiment, the openings 232 may have a critical dimension (CD) that is approximately 10 nm or less, or approximately 5 nm or less.

Figure 2D:
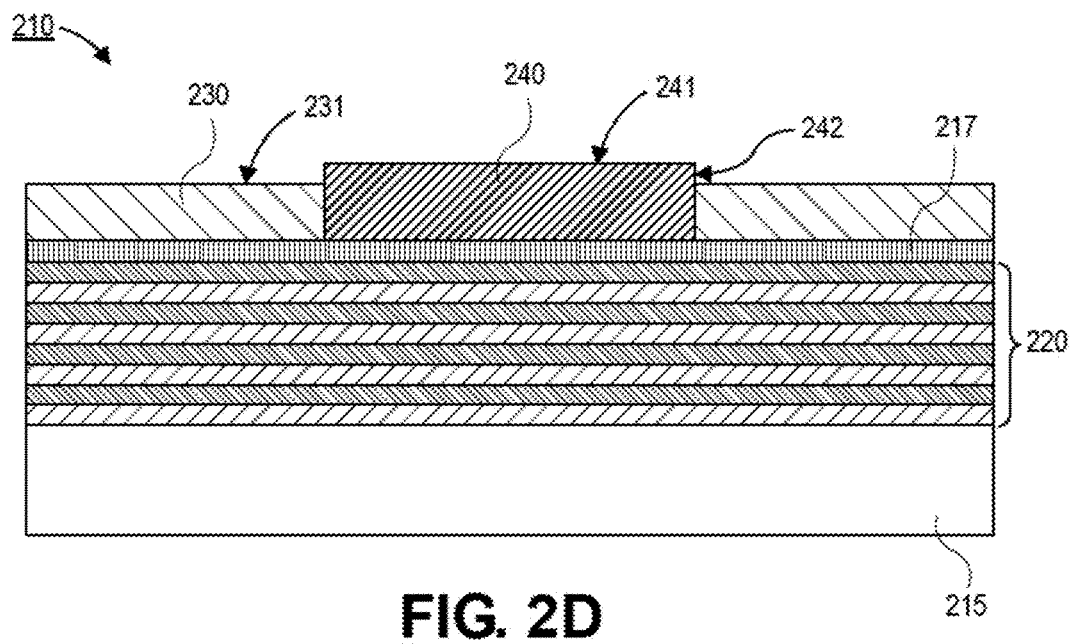
FIG. 2D is a cross-sectional illustration of the EUV reticle after the absorber layer is deposited with an electroless deposition process, in accordance with an embodiment.

Referring now to FIG. 2D, a cross-sectional illustration of the EUV reticle 210 after an absorber layer 240 is disposed in the openings 232 is shown, in accordance with an embodiment. In an embodiment, the absorber layer 240 may be deposited with an electroless deposition process. That is, the absorber layer 240 may be deposited with an autocatalytic process. In a particular embodiment, the capping layer 217 may function as a seed layer that initiates the autocatalytic reaction. In other embodiments, when the capping layer 217 is not a suitable material to initiate the autocatalytic reaction, a seed layer (not shown) may be disposed over the capping layer 217 (e.g., with a flash deposition of a seed layer with an electrolytic deposition process). As used herein, the absorber layer 240 may sometimes be referred to as the second layer.

The use of an electroless process to deposit the absorber layer 240 allows for a wider class of materials to be selected for the absorber layer 240. For example, the material composition of the absorber layer 240 may be chosen to have an extinction coefficient k (for EUV radiation) that is greater than the extinction coefficient k of Ta, TaN, or TaNB. For example, the extinction coefficient k of the absorber layer may be 0.04 or greater. In an embodiment, the absorber layer 240 may comprise a platinum group element. For example, the absorber layer 240 may comprise one or more of Ru, Rh, Pd, and Pt. In an embodiment, the absorber layer 240 may comprise transition metal elements. For example, the absorber layer 240 may comprise one or more of Ni, Co, and Au. In an embodiment, the absorber layer 240 may be a pure metal layer. That is, the absorber 240 may comprise a single element. In other embodiments, the absorber layer 240 may comprise an alloy of two or more elements. Particularly, it is noted that the absorber layer 240 may comprise a material that is resistant to low temperature (e.g., less than 130° C.) anisotropic etching processes, such as deep reactive ion etching (DRIE), reactive ion etching (RIE), or the like. That is, an absorber layer 240 formed with such materials is only capable of being formed in the desired pattern using additive processes, such as those described herein.

Since the electroless deposition process is an autocatalytic process, the material of the absorber layer 240 will deposit over the exposed portions of the capping layer 217 (or seed layer). The deposition of the absorber layer 240 is a bottom-up-fill (BUF) process. Additionally, since the electroless deposition is confined to the autocatalytic surfaces, there is minimal overburden that extends over the top surface 231 of the sacrificial layer 230. For example, when a top surface 241 of the absorber layer 240 extends above the top surface 231 of the sacrificial layer 230, the sidewalls 242 of the absorber layer 240 do not extend laterally past the sidewall of the openings 232 in the sacrificial layer 230.

In the illustrated embodiment, the top surface 241 of the absorber layer 240 is shown as extending above a top surface 231 of the sacrificial layer 230. However, it is to be appreciated that embodiments are not limited to such configurations. For example, the top surface 241 of the absorber layer 240 may be substantially coplanar with a top surface 231 of the sacrificial layer 230, or the top surface 241 of the absorber layer 240 may be below a top surface 231 of the sacrificial layer 230.

In an embodiment, the electroless deposition process may be implemented in an electroless deposition system. For example, the electroless deposition system may be similar to those described in greater detail below. However, it is to be appreciated that the electroless deposition may be implemented by immersing the EUV reticle in any suitable electroless solution. In a particular embodiment, the electroless deposition is controllable in order to provide highly uniform plating thicknesses of the absorber layer 240. For example, the thickness uniformity may be less than approximately 1 nm across a typical 104 mm×132 mm 4× pattern field on an EUV reticle. Furthermore, due to the increase in the extinction coefficient k compared to existing materials, the thickness of the absorber layer 240 may be reduced. As such, extremely low horizontal to vertical (HV) pattern bias is enabled. For example, the thickness of the absorber layer 240 may be approximately 50 nm or less. In some embodiments, the thickness of the absorber layer 240 may be approximately 20 nm or less, or approximately 15 nm or less for a binary mask architecture. This is particularly beneficial compared to existing absorber layers formed from materials that are subtractively patterned. Such existing absorber layers may have a thickness that is 50 nm or greater (e.g., between 50 nm and 85 nm).

In an embodiment, the electroless plating process may include precise control of one or more different plating parameters in order to achieve high repeatability and uniformity. For example, the controlled plating parameters may comprise one or more of pH, temperature, concentration of chemical species, such as metal ion, chelating agent, pH buffer, reducing agent, and other additives (if any), such as stabilizers, grain refiners, or the like.

Figure 2E:
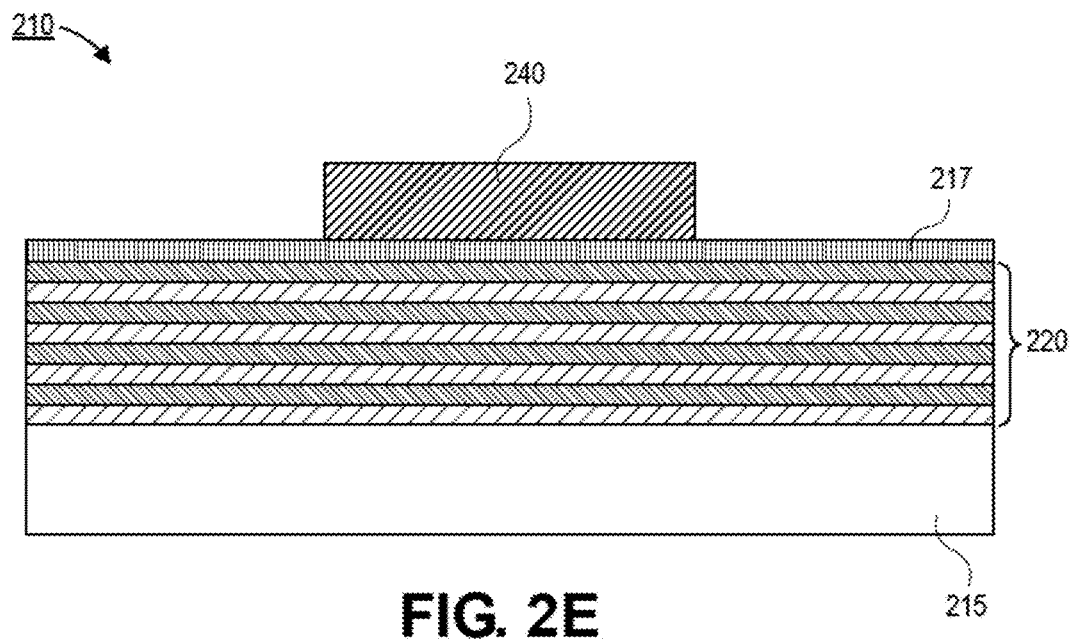
FIG. 2E is a cross-sectional illustration of the EUV reticle after the sacrificial layer is removed, in accordance with an embodiment.

Referring now to FIG. 2E, a cross-sectional illustration of the EUV reticle 210 after the sacrificial layer 230 is removed is shown, in accordance with an embodiment. In an embodiment, the sacrificial layer 230 may be removed with any suitable process that is low temperature and which does not significantly alter the absorber layer 240 and the capping layer 217.

Figure 3A:
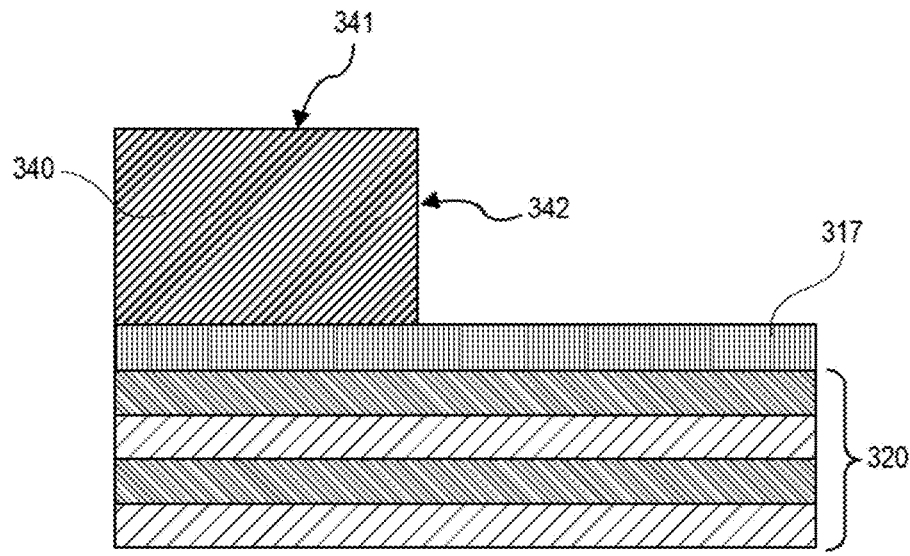
FIG. 3A is a cross-sectional illustration that more clearly shows a profile of the absorber layer, in accordance with an embodiment.

Referring now to FIG. 3A, a zoomed in cross-sectional illustration that more clearly depicts a profile of the absorber layer 340 is shown, in accordance with an embodiment. As shown, a top surface 341 of the absorber layer 340 and a sidewall surface 342 of the absorber layer 340 meet at a substantially orthogonal angle. That is, there is substantially no rounding at the corner between the top surface 341 and the sidewall surface 342. Furthermore, the sidewall surface 342 may be substantially vertical and without a footing or any undercut. The angular profile obtainable by embodiments disclosed herein provide improvements to the resolution of EUV reticles.

Figure 3B:
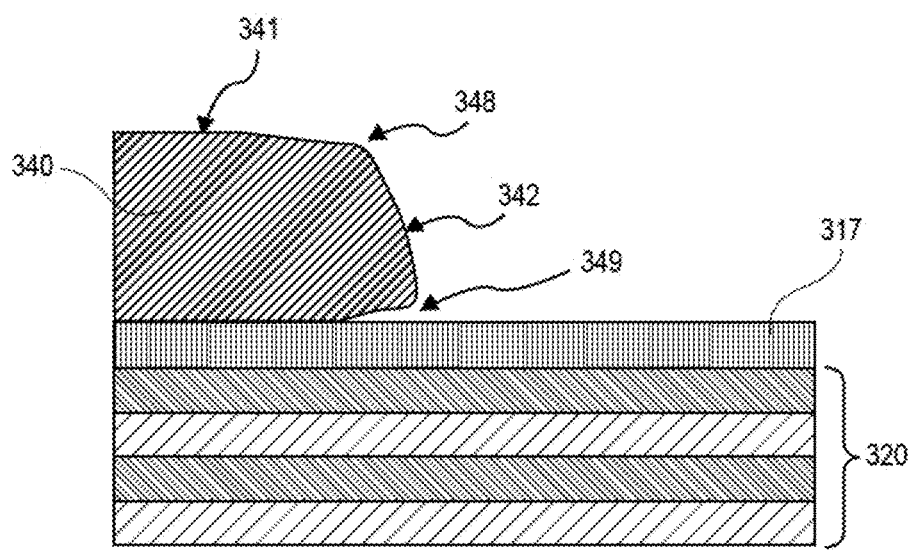
FIG. 3B is a cross-sectional illustration of a profile of an absorber formed with a subtractive process.

In contrast, FIG. 3B illustrates a cross-section of a profile of an absorber layer 340 that is fabricated using subtractive etching processes. As shown, a rounded corner 348 connects the top surface 341 to the sidewall surface 342. The rounded corner 348 may even exhibit an overhang beyond the sidewall surface 342 in some instances. Subtractively etched absorber layers may also comprise a footing and/or an undercut 349.

Figure 3C:
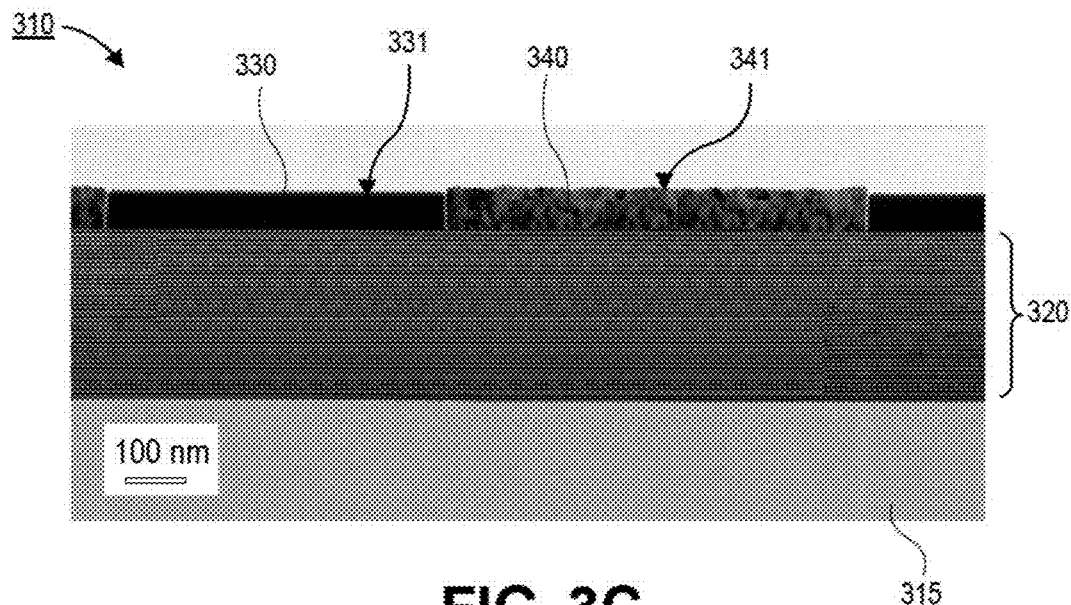
FIG. 3C is a cross-sectional image of an EUV reticle that depicts an absorber layer disposed in openings in a sacrificial layer, in accordance with an embodiment.

Referring now to FIG. 3C, a cross-sectional image of an EUV reticle 310 is shown, in accordance with an embodiment. In an embodiment, the EUV reticle 310 may comprise a substrate 315 and a mirror layer 320. A capping layer 317 may be formed over the top surface of the mirror layer 320, but is not clearly discernable in FIG. 3C. The EUV reticle 310 in FIG. 3C may correspond to the state of fabrication illustrated in FIG. 2D above. That is, the EUV reticle 310 may comprise a patterned sacrificial layer 330 and an absorber layer 340 in the openings of the patterned sacrificial layer 330. As shown, the electroless deposition process is highly selective to the openings in the sacrificial layer 330. In some embodiments, the selectivity may be tailored such that substantially no amount of the absorber layer 340 deposits over the top surface 331 of the sacrificial layer 330. Accordingly, the resulting absorber layer 340 will have precise and well defined edges that improves the performance of the EUV reticle 310.

In FIG. 3C, the top surface 341 of the absorber layer 340 exhibits a surface roughness that is detectible in the cross-sectional analysis. The surface roughness may be characteristic of an electroless deposition process. That is, the surface roughness of the top surface 341 of the absorber layer 340 may be greater than the surface roughness typically exhibited in layers deposited with processes such as PVD or IBD. For example, the RMS of the top surface 341 of the absorber layer 340 may be approximately 1 nm or greater. In the particular embodiment illustrated in FIG. 3C, the RMS of the top surface 341 is 2.1 nm. In contrast, typical RMS values of existing absorber materials (i.e., those deposited via PVD, IBD, et.) is approximately 0.2 nm or less. While increased RMS values are possible with electroless deposition process disclosed herein, it is to be appreciated that through control of chemistries and process conditions of the electroless process, embodiments may also include a top surface 341 of the absorber layer 340 that has an RMS similar to that of existing absorber materials (e.g., an RMS less than approximately 0.5 nm). Accordingly, embodiments allow for tailoring the roughness to meet a given optical property requirement.

In some embodiments, the surface roughness may impart desirable characteristics to the absorber layer 340. For example, in the case of a black border (i.e., a solid border surrounding the reticle), the increased surface roughness will result in a diffuse surface that further helps extinguish the EUV radiation. This improves reticle performance because over exposure at the corner regions on the die resulting from neighboring exposures is reduced.

While a surface 341 that exhibits an increased surface roughness may be desirable in some circumstances, it is to be appreciated that embodiments are not limited to absorber layers with high surface roughness. For example, the electroless process may be modified to reduce the resulting surface roughness. Other embodiments may include a polishing process (e.g., chemical mechanical polishing (CMP)) in order to reduce the surface roughness of the top surface 341.

Figure 4:
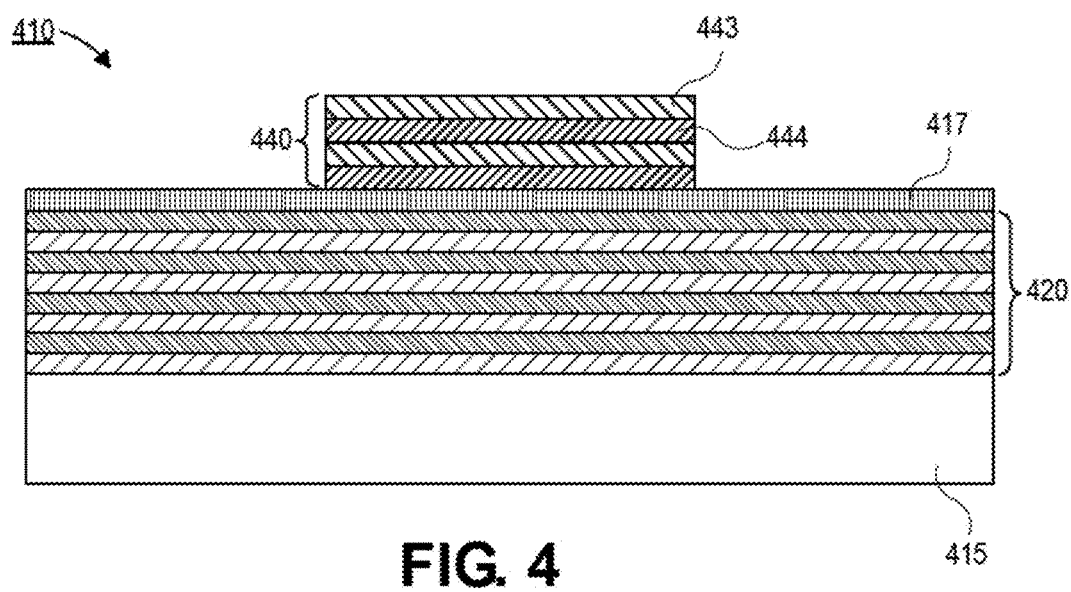
FIG. 4 is a cross-sectional illustration of an EUV reticle with an absorber layer that comprises a plurality of different material layers, in accordance with an embodiment.

Referring now to FIG. 4, a cross-sectional illustration of an EUV reticle 410 is shown, in accordance with an additional embodiment. The EUV reticle in FIG. 4 may be substantially similar to the EUV reticle 310 in FIG. 3C, with the exception of a modification to the absorber layer 440. For example, the EUV reticle 410 may comprise a substrate 415, a mirror layer 420, and a capping layer 417. The absorber layer 440 may be formed with a similar electroless process described above with respect to FIGS. 2A-2E, with the exception that the absorber layer 440 comprises a plurality of stacked absorber layers. For example, a first absorber layer 443 and a second absorber layer 444 may be stacked in an alternating pattern. In an embodiment, the first absorber layer 443 and the second absorber layer 444 may comprise different material compositions. While two different absorber layers 443 and 444 are shown in FIG. 4, it is to be appreciated that the absorber 440 may comprise any number of different material compositions in any order. In an embodiment, the different material compositions of the layer 443 and 444 may be obtained by changing the chemistry of the electroless solution.

Referring now to FIGS. 5A-5F, a series of cross-sectional illustrations depicting a process for forming a sub-resolution assist feature (SRAF) on an EUV reticle with an electroless process is shown, in accordance with an embodiment. In some embodiments, the SRAFs may comprise rim shifting features. Rim shifting features enhance contrast by imparting a strong phase shift to the incident EUV radiation at the feature edge. Accordingly, the rim shifting features should have indices of refraction n that are as far from 1.0 as possible. Examples of such materials are shown in region 107 of FIG. 1. Similar to the issues discussed above with respect to the limited selection of materials for the absorber layer, the SRAFs are currently limited to a small class of materials due to the need for low temperature processing (particularly, low temperature subtractive patterning). Accordingly, the use of electroless plating to form the SRAFs allows for an increase in the number of materials that can be used. That is, materials with more optimal indices of refraction n may be used to improve resolution of the reticle. While rim shifting features are used as an exemplary illustration of a process for forming an SRAF with electroless processes, it is to be appreciated that other types of SRAFs may also benefit from the use of an electroless deposition process.

Figure 5A:
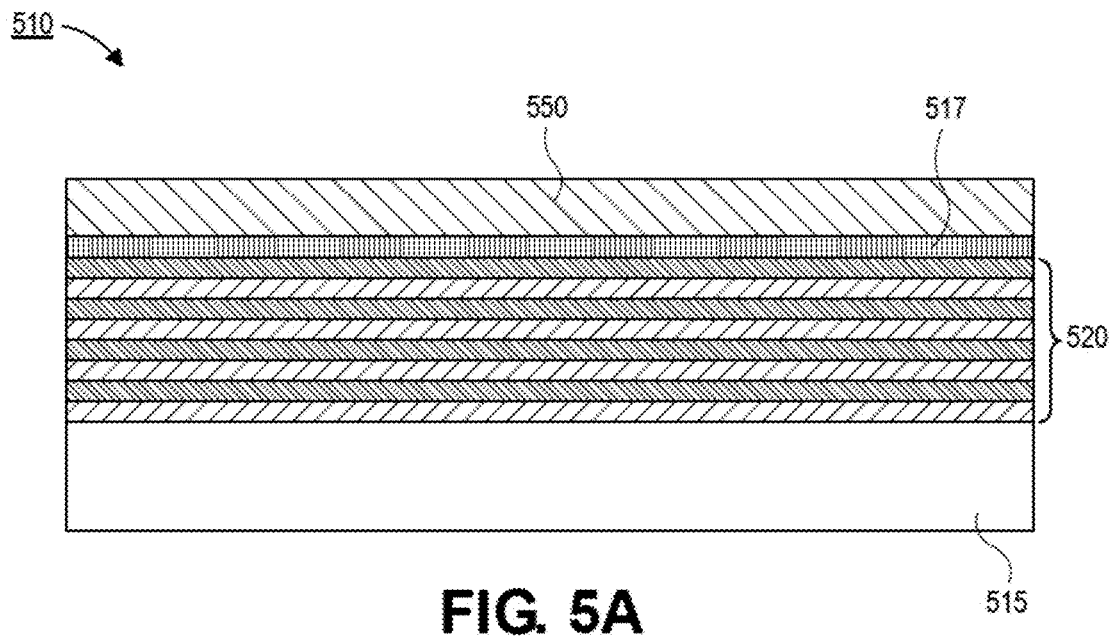
FIG. 5A is a cross-sectional illustration of an EUV reticle with an absorber layer disposed over the capping layer, in accordance with an embodiment.

Referring now to FIG. 5A, a cross-sectional illustration of an EUV reticle 510 is shown, in accordance with an embodiment. In an embodiment, the EUV reticle 510 may comprise a substrate 515 and a mirror layer 520 over the substrate 515. In some embodiments, a capping layer 517 may be disposed over the mirror layer 520. In an embodiment, the substrate 515, the mirror layer 520, and the capping layer 517 may be substantially similar to similarly numbered features in the EUV reticle 210 described above with respect to FIG. 2A.

In an embodiment, an absorber layer 550 may be disposed over the capping layer 517. In an embodiment, the absorber layer 550 may be the layer that will subsequently be patterned to form the absorber layer. In some embodiments, the absorber layer 550 may comprise Ta, TaN, TaNB, or the like. Particularly, the absorber layer 550 may comprise an absorber material that can be subtractively etched at substantially low temperatures (e.g., less than approximately 130° C.). In an embodiment, the absorber layer 550 may sometimes be referred to as the first layer.

Figure 5B:
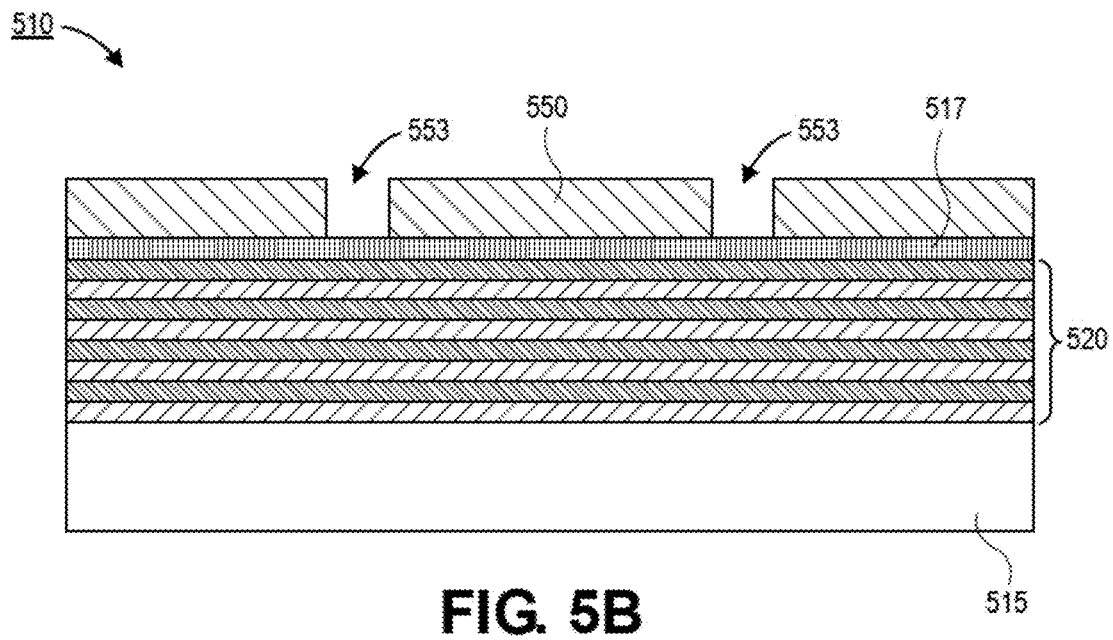
FIG. 5B is a cross-sectional illustration of the EUV reticle after the absorber layer is patterned, in accordance with an embodiment.

Referring now to FIG. 5B, a cross-sectional illustration of the EUV reticle 510 after the absorber layer 550 may be patterned to form a plurality of openings 553. In an embodiment, the absorber layer 550 may be patterned using any subtractive etching process. For example, the absorber layer 550 may be patterned with a RIE process or the like. The openings 553 may expose portions of the capping layer 517. In an embodiment, the openings 553 may be located at portions of the EUV reticle 510 where the SRAFs are desired.

Figure 5C:
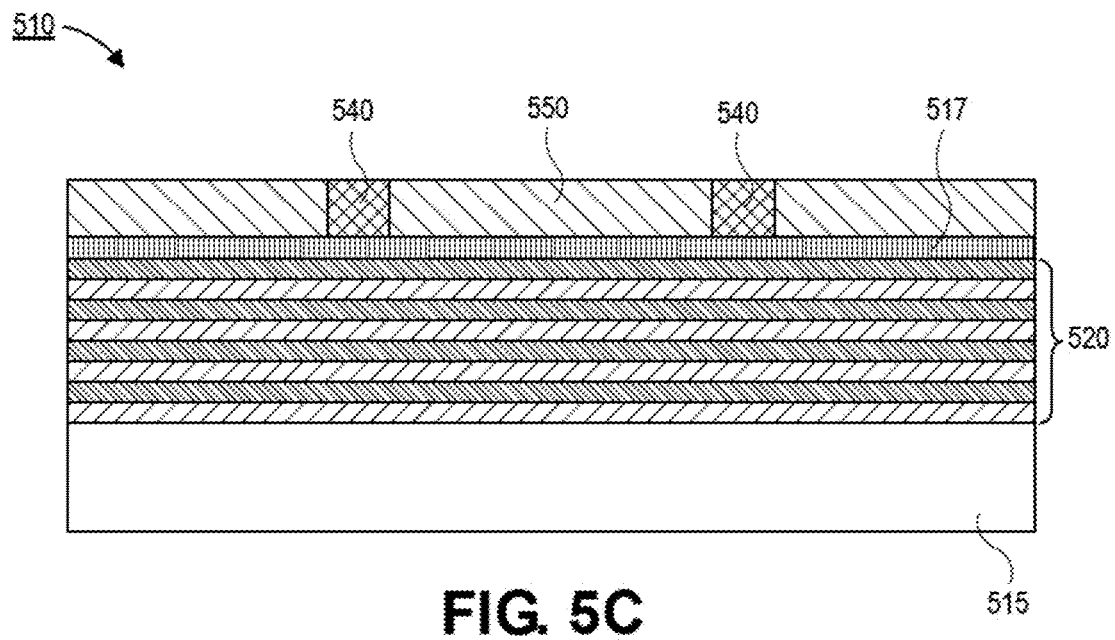
FIG. 5C is a cross-sectional illustration of the EUV reticle after a phase shift layer is disposed in the openings in the absorber layer with an electroless deposition process, in accordance with an embodiment.

Referring now to FIG. 5C, a cross-sectional illustration of the EUV reticle 510 after an SRAF layer 540 is disposed in the openings 553 of the absorber layer 550 is shown, in accordance with an embodiment. As used herein, the SRAF layer 540 may sometimes be referred to as a second layer. The SRAF layer 540 may be deposited with an electroless deposition process. The electroless deposition process may be substantially similar to the electroless deposition process described above with respect to FIG. 2D. The use of an electroless process to deposit the SRAF layer 540 allows for a wider class of materials to be selected for the SRAF layer 540. For example, the material composition of the SRAF layer 540 may be chosen to have an index of refraction (for EUV radiation) that is far from 1. For example, the index of refraction n may be 0.92 or less. In an embodiment, the SRAF layer 540 may be ruthenium (Ru), molybdenum (Mo), iridium (Ir), or any other suitable low index of refraction material. In an embodiment, the SRAF layer 540 may be a pure metal layer. That is, the SRAF layer 540 may comprise a single element. In other embodiments, the SRAF layer 540 may comprise an alloy of two or more elements. Particularly, it is noted that the SRAF layer 540 may comprise a material that is resistant to low temperature (e.g., less than 130° C.) anisotropic etching processes, such as DRIE, RIE, or the like. That is, a SRAF layer 540 formed with such materials is only capable of being formed in the desired pattern using additive processes, such as those described herein.

In a particular embodiment, the thickness of the SRAF layer 540 is closely controlled to impart a 180° phase shift to the incident EUV radiation. As noted above, the electroless process provides fine (and uniform) control of the thickness of the SRAF layer 540. Accordingly, embodiments disclosed herein enable improved resolution due to the accurate control of the phase shift.

Figure 5D:
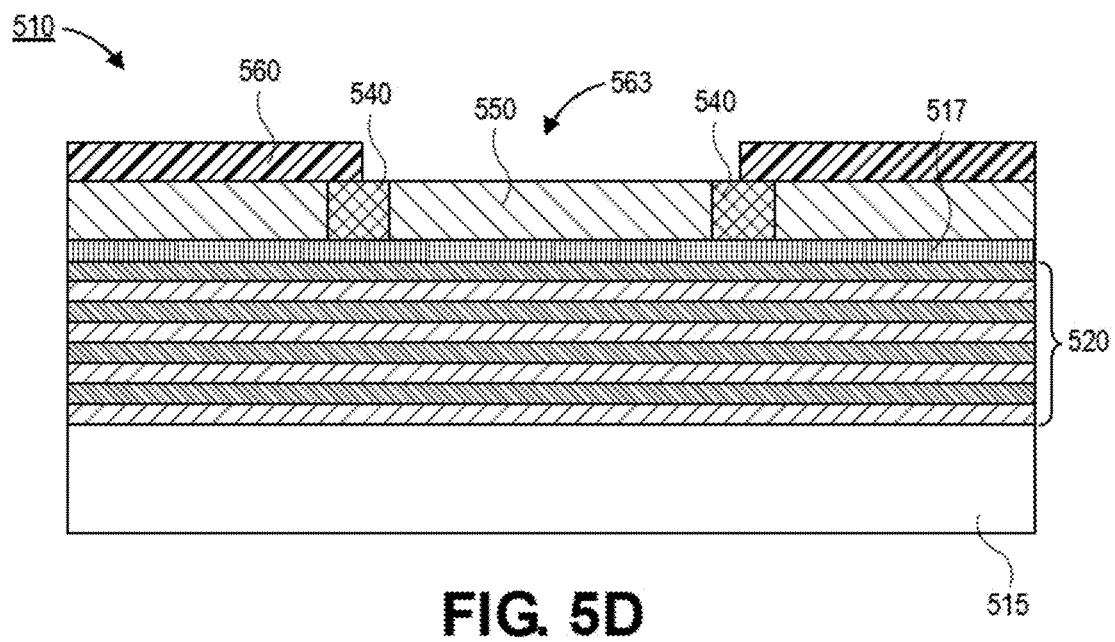
FIG. 5D is a cross-sectional illustration of the EUV reticle after a mask layer is disposed over the absorber layer and the phase shift layer and patterned to form an opening, in accordance with an embodiment.

Referring now to FIG. 5D, a cross-sectional illustration of the EUV reticle 510 after a mask layer 560 is disposed over the absorber layer 550 and the SRAF layer 540 and patterned is shown, in accordance with an embodiment. The mask layer 560 is patterned to provide one or more openings 563. The openings 563 expose portions of the absorber layer 550 between portions of the SRAF layer 540. The mask layer 560 may be a photoresist material or a hardmask that is lithographically patterned.

Figure 5E:
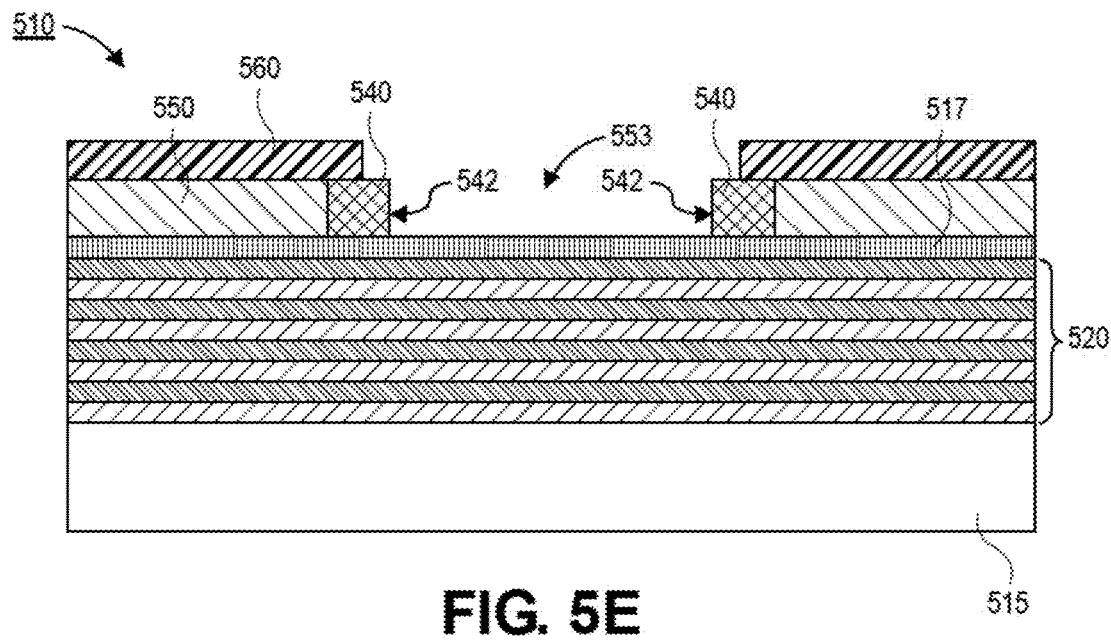
FIG. 5E is a cross-sectional illustration of the EUV reticle after a portion of the absorber layer is removed to expose sidewalls of the phase shift layer, in accordance with an embodiment.

Referring now to FIG. 5E, a cross-sectional illustration of the EUV reticle 510 after the absorber layer 550 is patterned a second time is shown, in accordance with an embodiment. In an embodiment, the absorber layer 550 is patterned to form openings 553. The openings 553 expose sidewall surfaces 542 of the SRAF layer 540. That is, a first sidewall surface 542 of the SRAF layer 540 remains in contact with a sidewall surface of the absorber layer 550 and a second sidewall surface 542 is exposed. The openings 553 may be formed with any suitable etching process. For example, the openings 553 may be formed with a deep reactive ion etching (DRIE) process or the like. In an embodiment, the etching process used to form the openings 553 is highly selective to the absorber layer 550 relative to the SRAF layer 540. For example, the selectivity of the absorber layer 550 to the SRAF layer 540 may be 100:1 or greater.

Figure 5F:
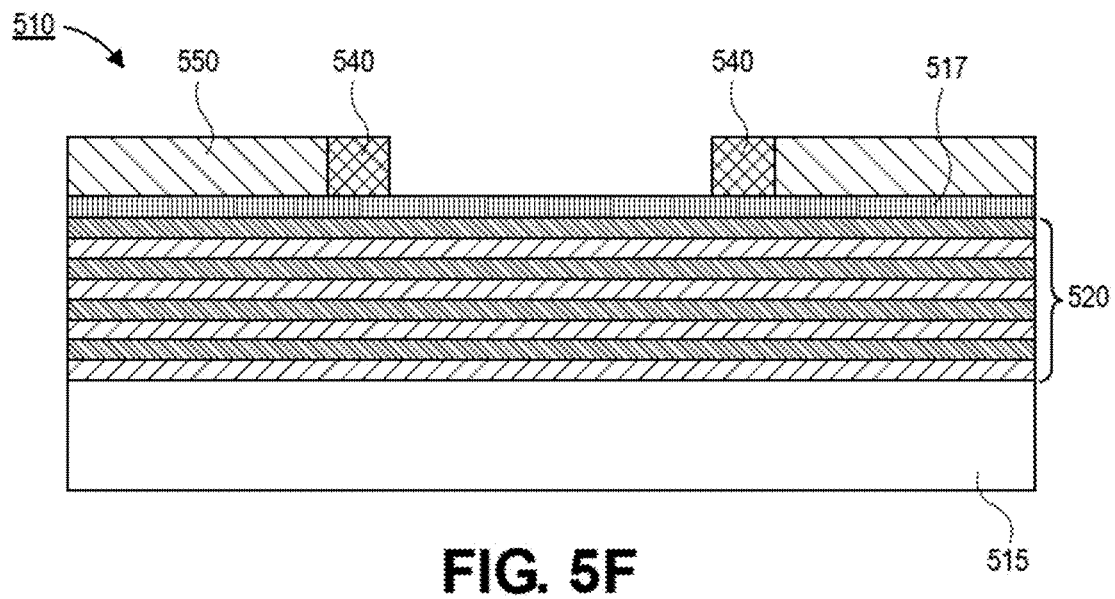
FIG. 5F is a cross-sectional illustration of the EUV reticle after the mask layer is removed, in accordance with an embodiment.

Referring now to FIG. 5F, a cross-sectional illustration of the EUV reticle 510 is shown after the mask layer 560 is removed. In an embodiment, the mask layer 560 may be removed with any suitable process, such as ashing or the like. The resulting EUV reticle 510 includes portions of the SRAF layer 540 that are adjacent to the edges of the absorber layer 550. That is, the SRAFs are formed along the edges of the absorber layer 550. In the particular embodiment shown in FIG. 5F, the SRAFs are rim shifting features that are designed to provide a 180° phase shift to increase the contrast of the EUV reticle 510.

Figure 5G:
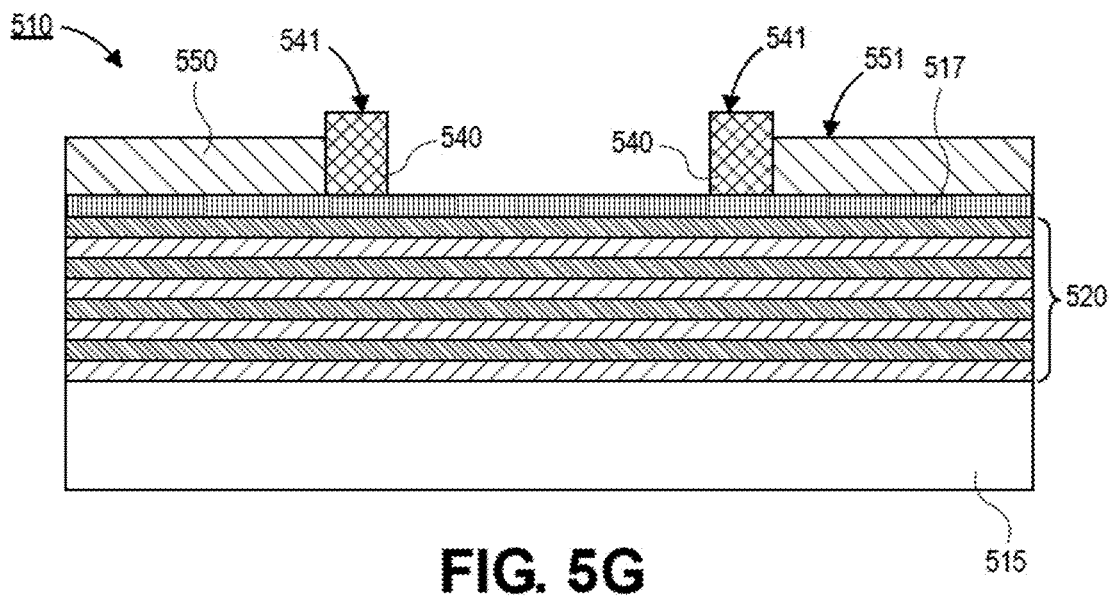
FIG. 5G is a cross-sectional illustration of an EUV reticle where the phase shift layer is taller than the absorber layer, in accordance with an embodiment.
Figure 5H:
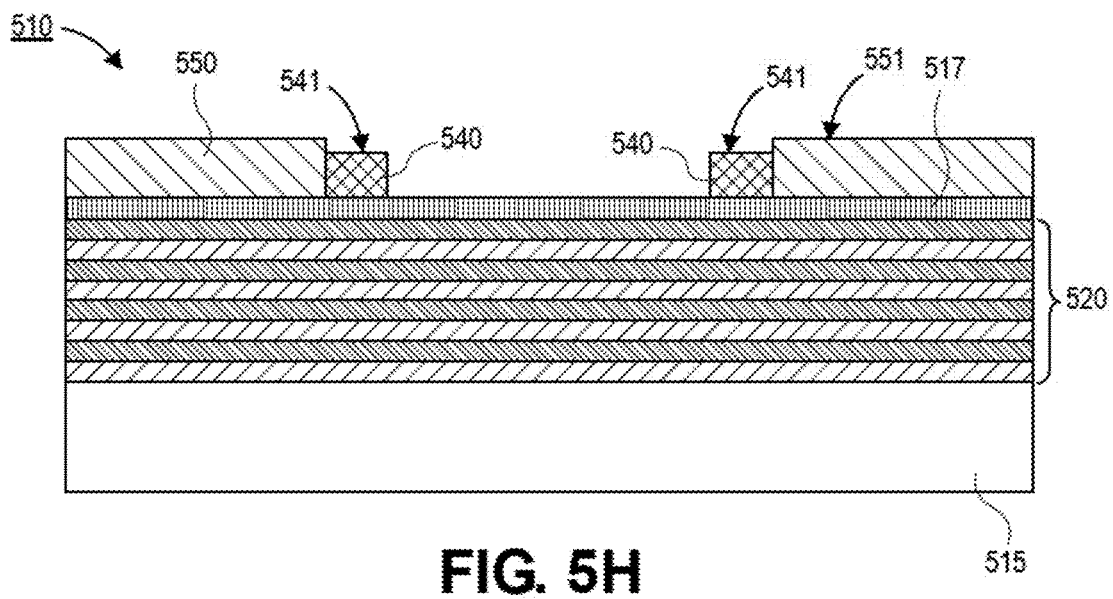
FIG. 5H is a cross-sectional illustration of an EUV reticle where the phase shift layer is shorter than the absorber layer, in accordance with an embodiment.

In FIG. 5F the top surfaces of the SRAF layer 540 are substantially coplanar with a top surface of the absorber layer 550. However, it is to be appreciated that the thickness of the SRAF layer 540 may be controlled to provide a 180° phase shift. That is, the thickness of the SRAF layer 540 controls the phase shift. Accordingly, the thickness of SRAF layer 540 may be such that the top surface 541 of the SRAF layer 540 is above the top surface 551 of the absorber layer 550 (as shown in FIG. 5G), or the thickness of the SRAF layer 540 may be such that the top surface 541 of the SRAF layer 540 is below the top surface 551 of the absorber layer 550 (as shown in FIG. 5H).

Similar to the absorber layer 340 described above, the SRAF layer 540 may also exhibit a substantially angular profile. That is a top surface 551 of the absorber layer 550 may intersect with a sidewall surface 542 of the SRAF layer 540 at substantially an orthogonal angle in some embodiments. Furthermore, the sidewall surfaces 542 may be substantially vertical with no undercut or footing. Accordingly, the resolution of such reticles is improved, compared to existing reticles with subtractively patterned SRAF features.

As noted above, the thickness uniformity and thickness control of the absorber layer or the SRAF formed with an electroless process is critical for high performance EUV reticles. Accordingly, the electroless plating system should have the ability to provide accurate control of chemistries, temperatures, and other electroless plating parameters. Electroless plating systems that provide such control are described with respect to FIGS. 6A-6C, in accordance with various embodiments.

Figure 6A:
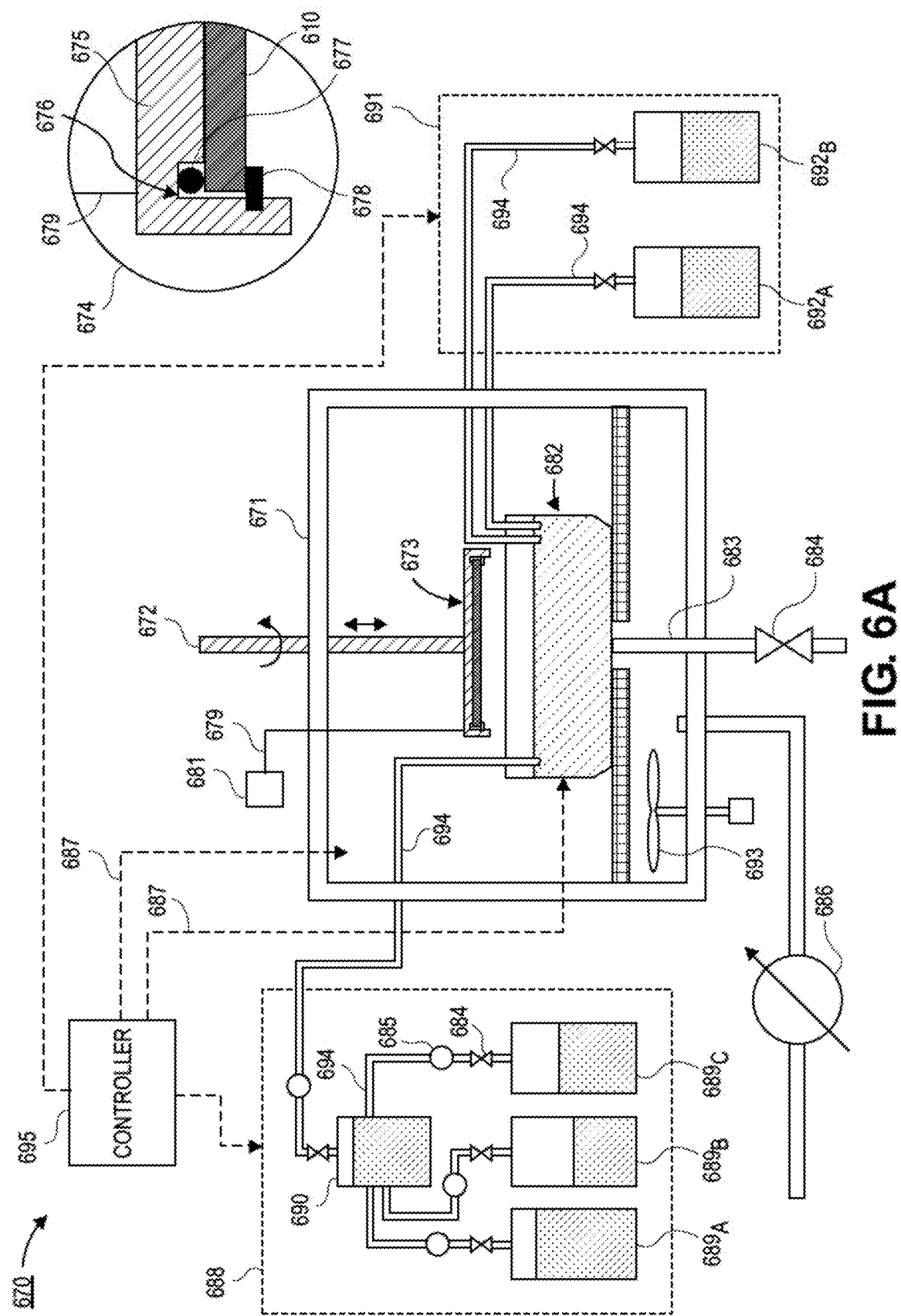
FIG. 6A is a schematic of an electroless deposition system for depositing a layer on an EUV reticle, where the EUV reticle is out of the bath, in accordance with an embodiment.
Figure 6B:
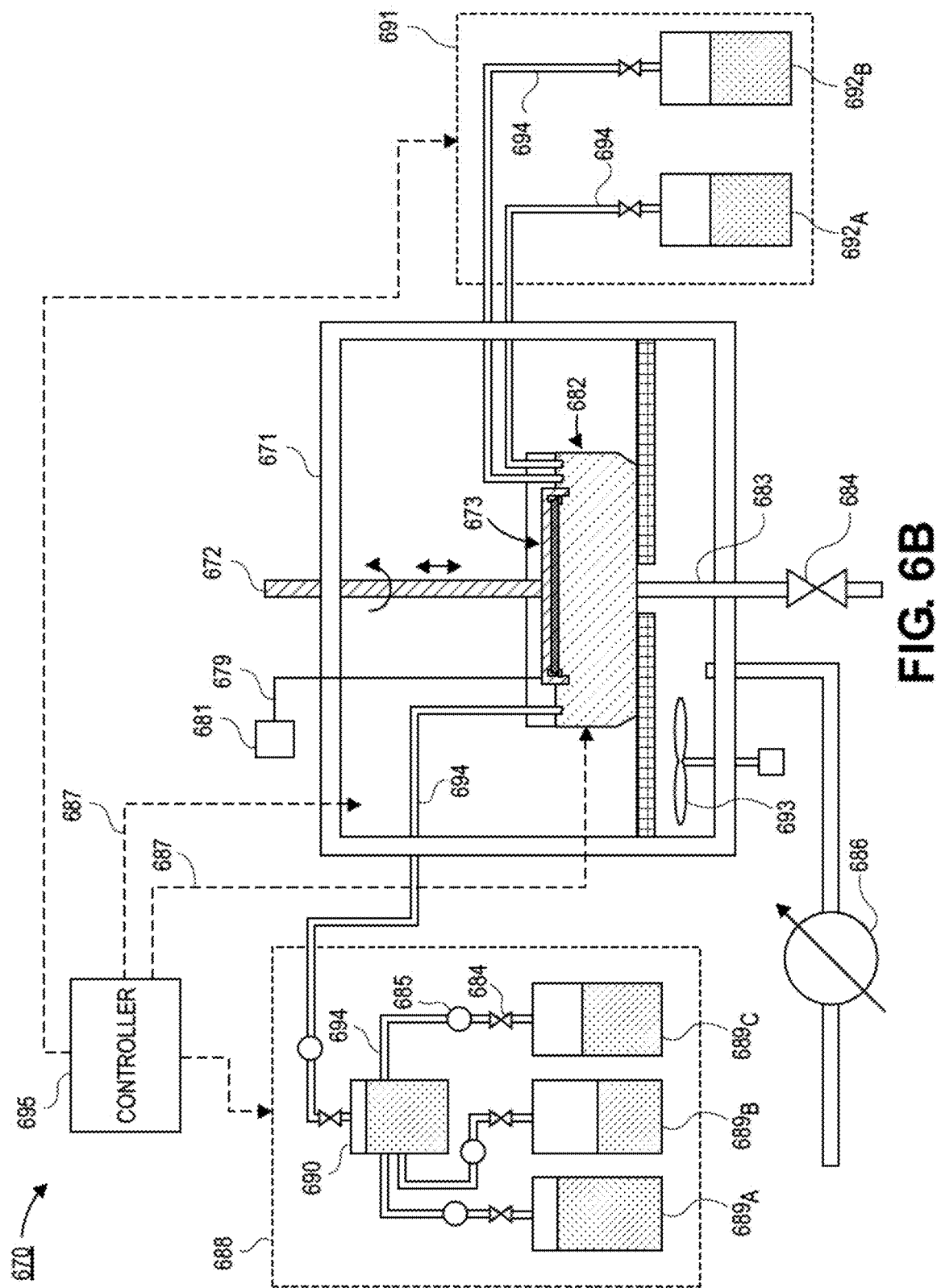
FIG. 6B is a schematic of the electroless deposition system where the EUV reticle is in the bath, in accordance with an embodiment.

Referring now to FIG. 6A and FIG. 6B, an electroless plating system 670 for plating on EUV reticles is shown, in accordance with an embodiment. In an embodiment the electroless plating system 670 comprises an isothermal chamber 671 that is heated with an inert gas (e.g., N, Ar, etc.) convection heater 686. A fan 693 may aid in the convection within the isothermal chamber 671. A bath 682 for holding the electroless solution is included in the isothermal chamber 671. The bath 682 may be coupled to a drain 683 controlled by a valve 684. The drain 683 may clear the electroless solution after plating is completed.

In an embodiment, a bank 688 of chemical reactants may be fluidically coupled to the bath 682 by one or more pipes 694. In an embodiment, the bank 688 may comprise a plurality of pressurized containers 689. For example three pressurized containers 689A, 689B, and 689c contain different reactants used for the electroless solution. Each of the containers 689 may be fluidically coupled to a mixing chamber 690. Control of the flow of chemicals from the pressurized containers 689 to the mixing chamber 690 may be provided by valves 684 and flow controllers 685. A valve 684 and a flow controller 685 may also be provided between the mixing chamber 690 and the bath 682. In an embodiment, a quenching bank 691 may also comprise pressurized containers 692. For example, a first pressurized container 692A may have a quenching solution that halts the plating process, and a second pressurized container 692B may have a cleaning solution that cleans the surface of the EUV reticle after the reaction has been quenched.

In an embodiment, the EUV reticle 610 may be held by a carrier assembly 673. Region 674 provides a zoomed in illustration of the carrier assembly 673 in order to more clearly depict the components of the carrier assembly 673. The carrier assembly 673 may comprise a main body 675. The main body 675 may have an O-ring groove 676. An O-ring 677 may sit in the groove 676. The O-ring 677 prevents the electroless solution from plating on the backside surface of the EUV reticle 610. In some embodiments, a conductive element 678 may also contact the EUV reticle 610. The conductive element 678 may be electrically coupled to a power source 681 by conductive line 679. The use of a conductive element 678 provides the ability to implement an electrolytic deposition (e.g., a flash deposition to provide a seed layer if the capping layer is not suitable for starting the autocatalytic reaction).

In an embodiment, the carrier assembly 673 is attached to a rod 672. The rod 672 may be displaced in the Z-direction in order to lower the EUV reticle 610 into the electroless solution in the bath 682 (as shown in FIG. 6B). Additionally, the rod 672 may be rotatable about the Z-axis in order to spin the EUV reticle 610. Spinning the EUV reticle 610 in the plating solution provides agitation to the solution which improves the plating uniformity. Additionally, the spinning may be used to dry the EUV reticle after cleaning.

In an embodiment, the quantity of the electroless solution is minimal since the EUV reticle 610 only needs to be immersed in approximately 1 mm to 2 mm of the electroless solution. Accordingly, embodiments may include a bath 682 sized to accommodate approximately 100 ml or less of electroless solution. Low volumes of solutions provides cost and environmental advantages over conventional large volume immersion bath systems employed in commercial electroless plating typical in the semiconductor industry.

In an embodiment, a controller 695 may provide control of the electroless plating system 670. The controller 695 may include one or more sensors 687 to monitor the chemistry of the plating solution, the temperature, or other plating parameters. In an embodiment, the controller 695 may also control the banks 688 and 691 and the drain 683 to add or remove chemical reactants, quenching solution, and/or cleaning solution to the bath 682. For example, the controller 695 may control an electroless plating process that comprises one or more of dispensing an electroless solution from the mixing chamber 690 into the bath 682, bringing the bath 682 and the remainder of the isothermal chamber 671 to a desired temperature, immersing the EUV reticle 610 into the electroless solution, draining the electroless solution through the drain 683 after the electroless plating is completed, filling the bath 682 with a quenching solution from container 692A, draining the quenching solution, filling the bath 682 with a cleaning and/or drying solution from container 692B, and removing the EUV reticle 610 from the bath 682.

The electroless plating system 670 in FIGS. 6A and 6B is just one example of an electroless plating system that may be used in accordance with various embodiments. An additional example of a suitable electroless plating system 670 is shown in FIG. 6C.

Figure 6C:
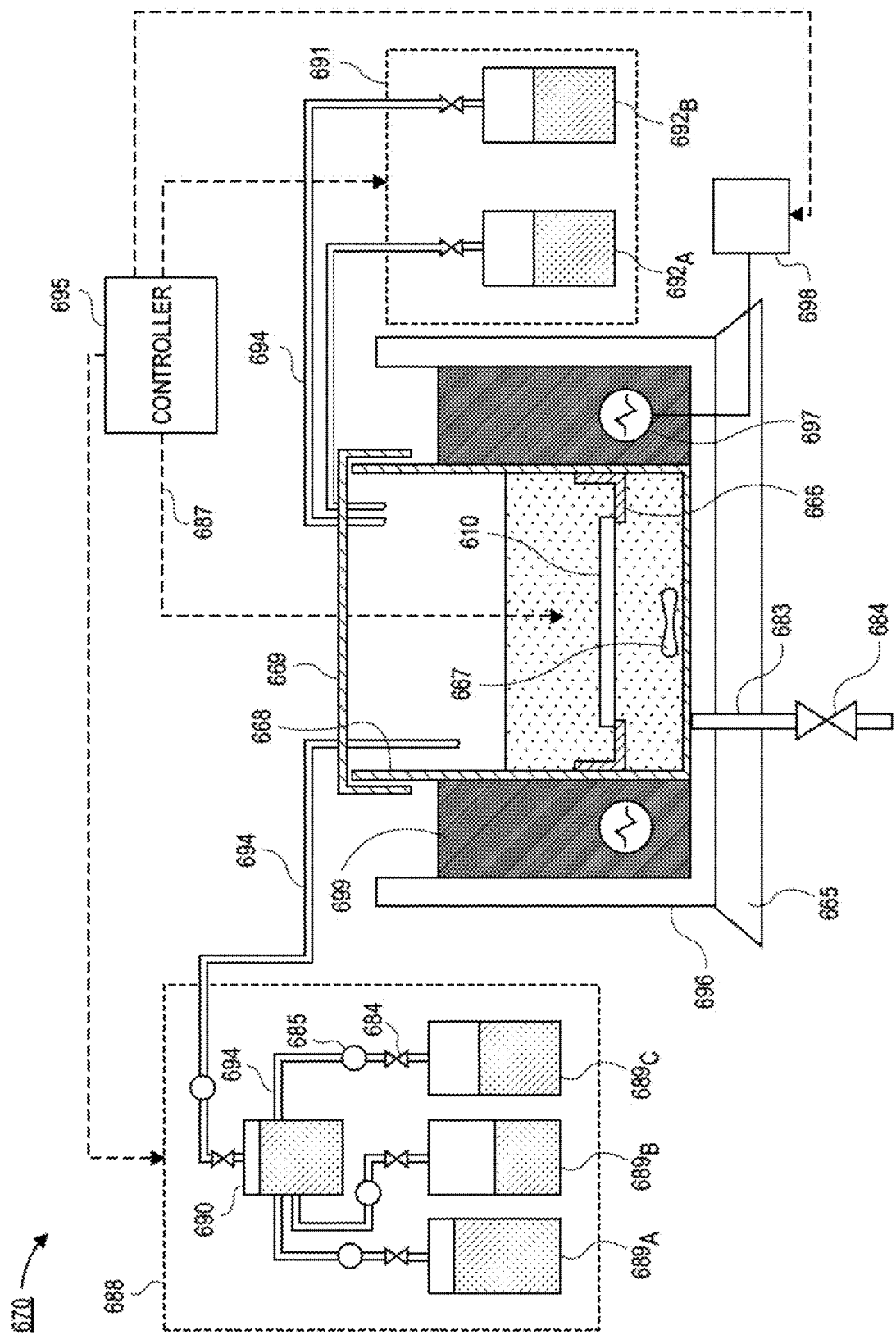
FIG. 6C is a schematic of an alternative electroless deposition system for depositing a layer on an EUV reticle, in accordance with an embodiment.

Referring now to FIG. 6C, a schematic of an electroless plating system 670 with a tank configuration is shown, in accordance with an embodiment. In an embodiment, the electroless plating system 670 may include an outer tank 696. The outer tank 696 may be filled with a heat conducting medium 699 that is heated with heating elements 697 connected to a power source 698. A reaction vessel 668 may sit in the outer tank 696 with a lid 669 over the top of the tank 696. The EUV reticle 610 may rest on supports 666 in the reaction vessel 668. In an embodiment, a magnetic stirrer 667 may be placed in the reaction vessel 668 to agitate the electroless solution. The magnetic stirrer 667 may be driven by a heated stirring base 665. The controller 695 may control the electroless deposition process similar to the controller 695 described above with respect to FIGS. 6A and 6B.

Embodiments disclosed herein include EUV reticles that are used in the patterning of semiconductor devices. For example, a source of EUV light may be propagated towards the EUV reticle. The EUV reticle selectively reflects the EUV light to desired locations on a substrate. The reflected portions of the EUV light may be directed towards a photosensitive resist layer on the substrate. The exposed portions of the resist layer may then be developed to provide a pattern that can be transferred into one or more layers of the substrate (e.g., through etching and/or modifying exposed portions of the substrate) and/or used as a mask to selectively deposit additional layers on the substrate.

In an embodiment, the substrate may be a semiconductor substrate, such as a semiconductor wafer or the like. The semiconductor substrate may comprise a silicon substrate, a silicon on insulator (SOI) substrate, a semiconductor substrate, or any other semiconductor material. The substrate may also comprise other materials such as glass, sapphire, or the like. The semiconductor devices fabricated using EUV reticles disclosed herein may include transistors used in semiconductor dies, such as processor dies, graphics dies, memory dies, or any die. The EUV reticles disclosed herein may be used to fabricate the transistors, the interconnect layers providing electrical connections to the transistors, any other portion of the semiconductor die, or electronic packaging for the semiconductor die. The semiconductor devices may also include display technologies, photovoltaic technologies, or any other device that may benefit from the fine critical dimension patterning provided by EUV reticles disclosed herein.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a method of forming an extreme ultraviolet (EUV) reticle, comprising: providing a reticle, wherein the reticle comprises: a substrate; a mirror layer over the substrate, wherein the mirror layer comprises a plurality of first mirror layers and second mirror layers in an alternating pattern; and a capping layer over the mirror layer; disposing a first layer over the capping layer; patterning an opening in the first layer; and disposing a second layer in the opening, wherein the second layer is disposed with an electroless deposition process.

Example 2: the method of Example 1, wherein the second layer comprises an element of the platinum group.

Example 3: the method of Example 2, wherein the second layer comprises one or more of ruthenium, rhodium, palladium, and platinum.

Example 4: the method of Examples 1-3, wherein the second layer comprises a transition metal element.

Example 5: the method of Example 4, wherein the second layer comprises one or more of nickel, cobalt, and gold.

Example 6: the method of Examples 1-5, wherein the capping layer is a seed layer for the electroless deposition of the second layer.

Example 7: the method of Example 6, wherein the capping layer is ruthenium.

Example 8: the method of Examples 1-7, wherein a top surface of the second layer extends above a top surface of the first layer.

Example 9: the method of Examples 1-8, further comprising: removing the first layer.

Example 10: the method of Examples 1-9, further comprising: removing a portion of the first layer, wherein a first sidewall surface of the second layer contacts a remaining portion of the first layer, and wherein removal of the portion of the first layer exposes a second sidewall surface of the second layer.

Example 11: the method of Example 10, wherein the second layer is a sub-resolution assist feature (SRAF).

Example 12: an extreme ultraviolet (EUV) reticle, comprising: a substrate; a mirror layer over the substrate, wherein the mirror layer comprises a plurality of first mirror layers and second mirror layers in an alternating pattern; a capping layer over the mirror layer; and an absorber over the capping layer, wherein the absorber comprises a material composition that is resistant to anisotropic etching at temperatures at or below approximately 130° C.

Example 13: the EUV reticle of Example 12, wherein the absorber comprises a platinum group element.

Example 14: the EUV reticle of Example 13, wherein the absorber comprises one or more of ruthenium, rhodium, palladium, and platinum.

Example 15: the EUV reticle of Examples 12-14, wherein the absorber comprises a transition metal element.

Example 16: the EUV reticle of Example 15, wherein the absorber comprises one or more of nickel, cobalt, and gold.

Example 17: the EUV reticle of Examples 12-16, wherein the absorber comprises a first layer having a first material composition and a second layer having a second material composition that is different than the first layer.

Example 18: an extreme ultraviolet (EUV) reticle, comprising: a substrate; a mirror layer over the substrate, wherein the mirror layer comprises a plurality of first mirror layers and second mirror layers in an alternating pattern; a capping layer over the mirror layer; and an absorber over the capping layer; and a sub-resolution assist feature (SRAF) adjacent to sidewalls of the absorber, wherein the SRAF comprises a material composition that is resistant to anisotropic etching at temperatures at or below approximately 130° C.

Example 19: the EUV reticle of Example 18, wherein a first sidewall of the SRAF is contacted by a sidewall of the absorber, and wherein a second sidewall of the SRAF is exposed.

Example 20: the EUV reticle of Example 18 or Example 19, wherein the SRAF is a rim shifting feature, wherein a thickness of the SRAF provides a 180° shift of incident EUV radiation.

Example 21: the EUV reticle of Example 20, wherein a top surface of the absorber is not substantially coplanar with a top surface of the SRAF.

Example 22: the EUV reticle of Examples 18-21, wherein the SRAF comprises one or more of ruthenium, molybdenum, and iridium.

Example 23: an extreme ultraviolet (EUV) reticle plating system, comprising: a bath; a plurality of reactant containers each for storing different reactants for an electroless plating process, wherein the plurality of reactant containers are fluidically coupled to the bath; a cleaning container fluidically coupled to the bath, wherein the cleaning container is for storing a cleaning solution or a quenching solution; a drain line fluidically coupled to the bath; and a support for securing the EUV reticle in the bath.

Example 24: the EUV reticle plating system of Example 23, wherein the support comprises a rod, wherein the rod is retractable in a Z-direction and rotatable about a Z-axis to enable spinning the EUV reticle in the bath.

Example 25: the EUV reticle plating system of Example 23 or Example 24, wherein the plurality of reactant containers are fluidically coupled to a mixing container, wherein the mixing container is fluidically coupled to the bath.

What is claimed is:

1. A method of forming an extreme ultraviolet (EUV) reticle, comprising:
    providing a reticle, wherein the reticle comprises:
        a substrate;
        a mirror layer over the substrate, wherein the mirror layer comprises a plurality of first mirror layers and second mirror layers in an alternating pattern; and
        a capping layer over the mirror layer;
    disposing a first layer over the capping layer;
    patterning an opening in the first layer; and
        disposing a second layer in the opening, wherein the second layer is disposed with an electroless deposition process.

2. The method of claim 1, wherein the second layer comprises an element of the platinum group.

3. The method of claim 2, wherein the second layer comprises one or more of ruthenium, rhodium, palladium, and platinum.

4. The method of claim 1, wherein the second layer comprises a transition metal element.

5. The method of claim 4, wherein the second layer comprises one or more of nickel, cobalt, and gold.

6. The method of claim 1, wherein the capping layer is a seed layer for the electroless deposition of the second layer.

7. The method of claim 6, wherein the capping layer is ruthenium.

8. The method of claim 1, wherein a top surface of the second layer extends above a top surface of the first layer.

9. The method of claim 1, further comprising:
    removing the first layer.

10. The method of claim 1, further comprising:
    removing a portion of the first layer, wherein a first sidewall surface of the second layer contacts a remaining portion of the first layer, and wherein removal of the portion of the first layer exposes a second sidewall surface of the second layer.

11. The method of claim 10, wherein the second layer is a sub-resolution assist feature (SRAF).

12. An extreme ultraviolet (EUV) reticle, comprising:
    a substrate;
    a mirror layer over the substrate, wherein the mirror layer comprises a plurality of first mirror layers and second mirror layers in an alternating pattern;
    a capping layer over the mirror layer; and
    an absorber over the capping layer, wherein the absorber comprises a material composition that is resistant to anisotropic etching at temperatures at or below approximately 130° C.

13. The EUV reticle of claim 12, wherein the absorber comprises a platinum group element.

14. The EUV reticle of claim 13, wherein the absorber comprises one or more of ruthenium, rhodium, palladium, and platinum.

15. The EUV reticle of claim 12, wherein the absorber comprises a transition metal element.

16. The EUV reticle of claim 15, wherein the absorber comprises one or more of nickel, cobalt, and gold.

17. The EUV reticle of claim 12, wherein the absorber comprises a first layer having a first material composition and a second layer having a second material composition that is different than the first layer.

18. An extreme ultraviolet (EUV) reticle, comprising:
    a substrate;
    a mirror layer over the substrate, wherein the mirror layer comprises a plurality of first mirror layers and second mirror layers in an alternating pattern;
    a capping layer over the mirror layer; and
    an absorber over the capping layer; and
    a sub-resolution assist feature (SRAF) adjacent to sidewalls of the absorber, wherein the SRAF comprises a material composition that is resistant to anisotropic etching at temperatures at or below approximately 130° C.

19. The EUV reticle of claim 18, wherein a first sidewall of the SRAF is contacted by a sidewall of the absorber, and wherein a second sidewall of the SRAF is exposed.

20. The EUV reticle of claim 18, wherein the SRAF is a rim shifting feature, wherein a thickness of the SRAF provides a 180° shift of incident EUV radiation.

21. The EUV reticle of claim 20, wherein a top surface of the absorber is not substantially coplanar with a top surface of the SRAF.

22. The EUV reticle of claim 18, wherein the SRAF comprises one or more of ruthenium, molybdenum, and iridium.

* * * * *